United States Patent [19]
Yamazaki et al.

[11] Patent Number: 5,699,297
[45] Date of Patent: Dec. 16, 1997

[54] METHOD OF REWRITING DATA IN A MICROPROCESSOR ADDITIONALLY PROVIDED WITH A FLASH MEMORY

[75] Inventors: Akihiro Yamazaki, Tochigi-ken; Takamichi Kasai, Ichikawa, both of Japan

[73] Assignee: Kabushiki Kaisha Toshiba, Kawasaki, Japan

[21] Appl. No.: 654,886

[22] Filed: May 29, 1996

[30] Foreign Application Priority Data

May 30, 1995 [JP] Japan .................................. 7-131787

[51] Int. Cl.$^6$ .................................................. G11C 11/34
[52] U.S. Cl. .................................. 365/185.25; 365/185.11
[58] Field of Search ........................... 365/185.25, 185.11

[56] References Cited

U.S. PATENT DOCUMENTS 5,511,020 4/1996 Hu et al. .......................... 365/185.25

FOREIGN PATENT DOCUMENTS 5-250884 9/1993 Japan .

Primary Examiner—David C. Nelms
Assistant Examiner—F. Niranjan
Attorney, Agent, or Firm—Finnegan, Henderson, Farabow, Garrett & Dunner, L.L.P.

[57] ABSTRACT

The present invention relates to a method of rewriting data in a microcomputer additionally provided with a flash memory having a refresh mode, in which the data retained in an area arbitrarily specified in the flash memory is transferred to a RAM for temporary evacuation and after the data in the area has been erased, the data evacuated to the flash memory is written into the area again.

4 Claims, 5 Drawing Sheets

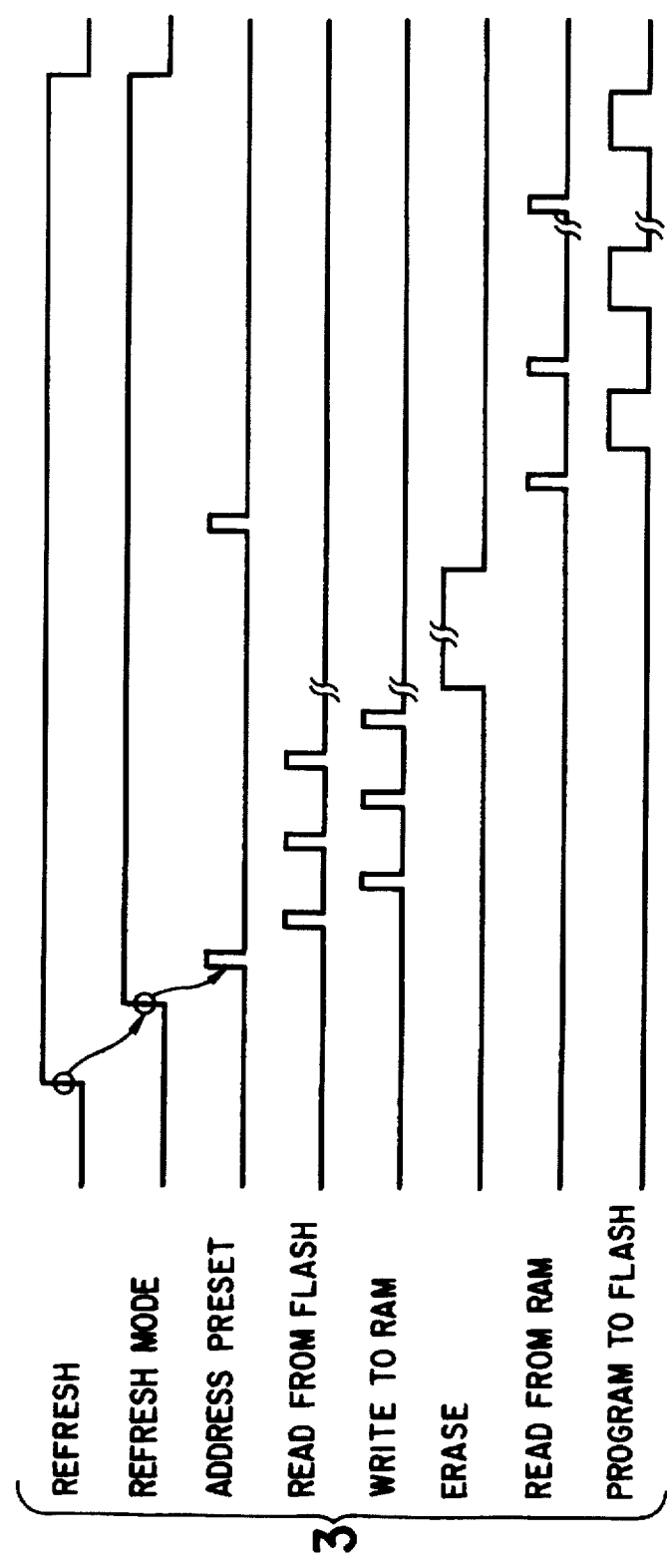

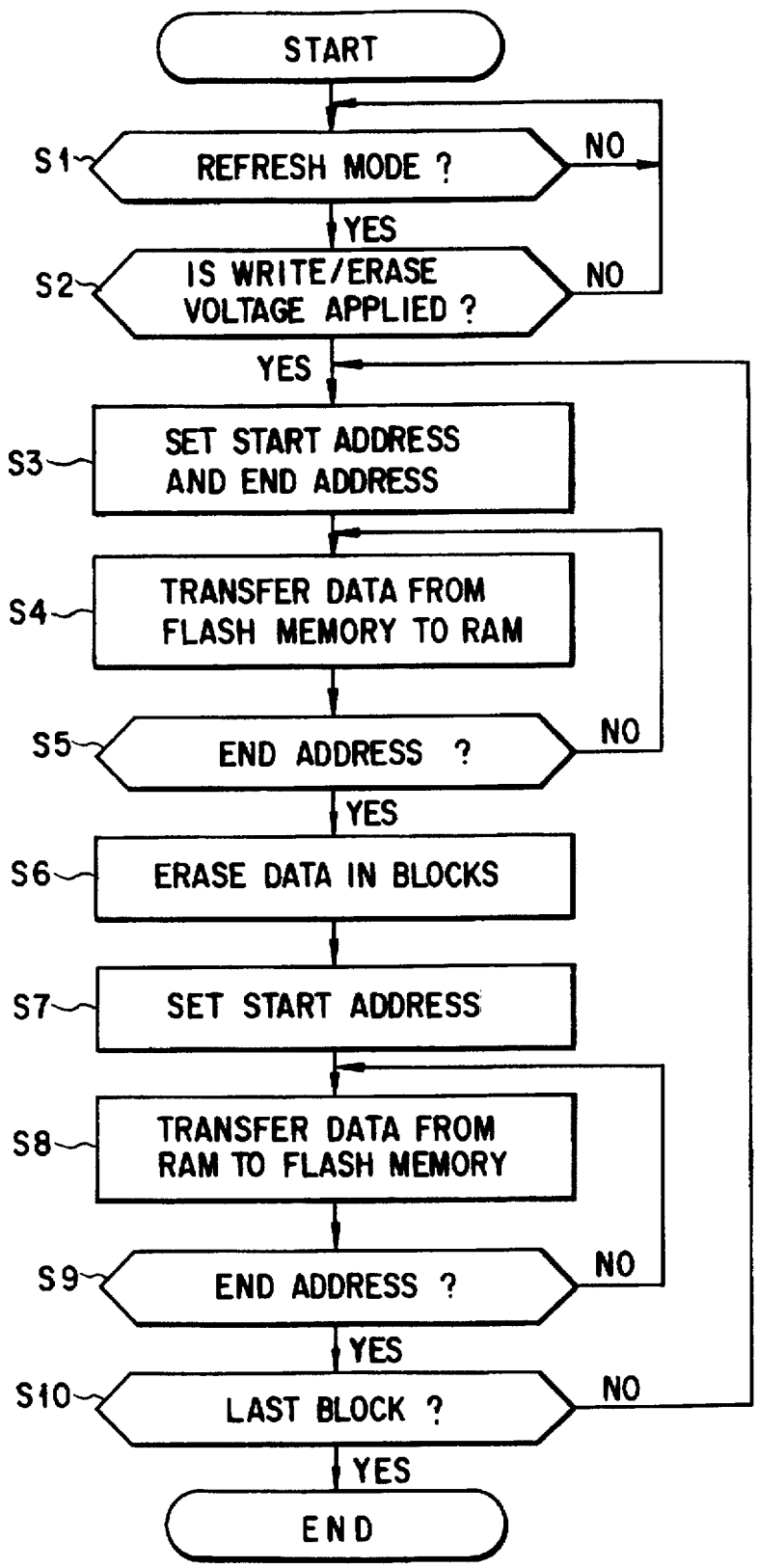
F I G. 6

METHOD OF REWRITING DATA IN A MICROPROCESSOR ADDITIONALLY PROVIDED WITH A FLASH MEMORY

BACKGROUND OF THE INVENTION

1. Field of the Invention

This invention relates to a method of rewriting data in a microprocessor additionally provided with a flash memory which is a nonvolatile memory and whose memory array is divided.

2. Description of the Related Art

There have been cases where EPROMs or EEPROMs that enable the rewriting of data are used as nonvolatile memory provided on a microcomputer. With the EPROMs, the data retained until that time can be erased by projecting ultraviolet light at the specific position and new data can be written therein. To rewrite the contents of the memory, it is necessary to remove it from the board on which it is mounted and then rewrite the contents of the memory alone, because ultraviolet light may affect the other component parts or the memory may be mounted in a position where ultraviolet light cannot be projected.

With the EEPROMs, however, the data retained until that time can be erased by applying a specific electric signal and new data can be written in. Specifically, with the EEPROMs, an erase and write wiring pattern is formed beforehand on a wiring circuit board on which they are to be mounted. By applying a specific electric signal, the retained data can be erased and new data written in with the memory left mounted, or without removing the memory.

Since an EEPROM is provided with a select transistor, its cell size as a whole is several times larger than that of an EPROM, making integration more difficult. To avoid this problem, flash EEPROMs whose memory cells each are composed of a single transistor have recently been used. With the flash EEPROMs mounted on a wiring circuit board, the contents of them can be rewritten by a specific electric signal, making it possible to achieve a much larger memory capacity.

In the case of a NOR flash EEPROM as shown in FIG. 7, however, data writing is based on the principle of injecting hot electrons generated near the drain into the floating gate by the use of a high voltage applied to the control gate, as with the EPROM. In addition, data erasing is based on the principle of grounding the control gate and extracting the hot electrons from the floating gate by the use of a tunnel current generated by a high voltage applied to the source.

Therefore, an oxide film under the floating gate is as thin as about 10 nm and is known as a tunnel oxide film.

For this reason, the memory cells in a flash EEPROM give rise to various disturbances that are technically difficult to solve. For example, one technical approach is to increase the quality of the tunnel oxide film to eradicate defects in terms of film forming techniques. Additionally, in constructing a circuit, stress applied to the parts is avoided as much as possible.

FIG. 8 shows various disturbances occurring in a flash EEPROM. With this configuration, since memory cell 11 shares a word line with memory cell 12 in a write operation, this causes the gate disturbance that the gate goes to a high potential. Furthermore, since memory cell 13 has a common bit line, this causes the drain disturbance that a high voltage is applied to the drain. Additionally, when block 1 is being erased, block 2 encounters the source disturbance that the source goes to a high potential. When all the blocks are erased in unison, these disturbances or stresses are not a problem, because they last for only a relatively short time. The source disturbance will not particularly take place in unison erasure.

In practical use, however, there are many cases where block erasure is used. Normally, $10^4$ to $10^6$ writes and erases are needed.

Under some service conditions, only a specific block may be used repeatedly and be written into and erased from $10^4$ to $10^6$ times. In this case, there are blocks whose contents have not been rewritten at all. Those blocks are put under the stress in rewriting the contents of the other blocks, $10^4$ to $10^6$ times, as compared with unison erasure, with the result that the data stored in those blocks may be affected.

From the viewpoint of a good maintenance of the data stored for a long time, disturbances in the drain voltage and gate voltage applied in a read operation are a problem.

SUMMARY OF THE INVENTION

The object of the present invention is to provide a method of rewriting data in a microcomputer additionally provided with a flash memory which has a simple configuration and prevents the retained data from being degraded due to the driving of the memory.

The foregoing object is accomplished by providing a method of rewriting data in a microcomputer provided with not only a flash memory which enables data to be electrically rewritten and whose memory cell area is divided into a plurality of blocks, but also a memory device that enables data to be written and read, the method comprising the steps of: evacuating the data in an area consisting of one or more of the blocks in the flash memory to the memory device; erasing the evacuated data in the area in the flash memory; writing the evacuated data from the memory device again into the original area; and refreshing the data retained in the flash memory area by area, each area being formed on a block basis.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 3 is a timing chart to help explain data rewriting in the hardware mode in the embodiment;

FIG. 6 is a flowchart to help explain a method of rewriting data in the embodiment;

DETAILED DESCRIPTION OF THE PREFERRED EMBODIMENT

Figure 1:
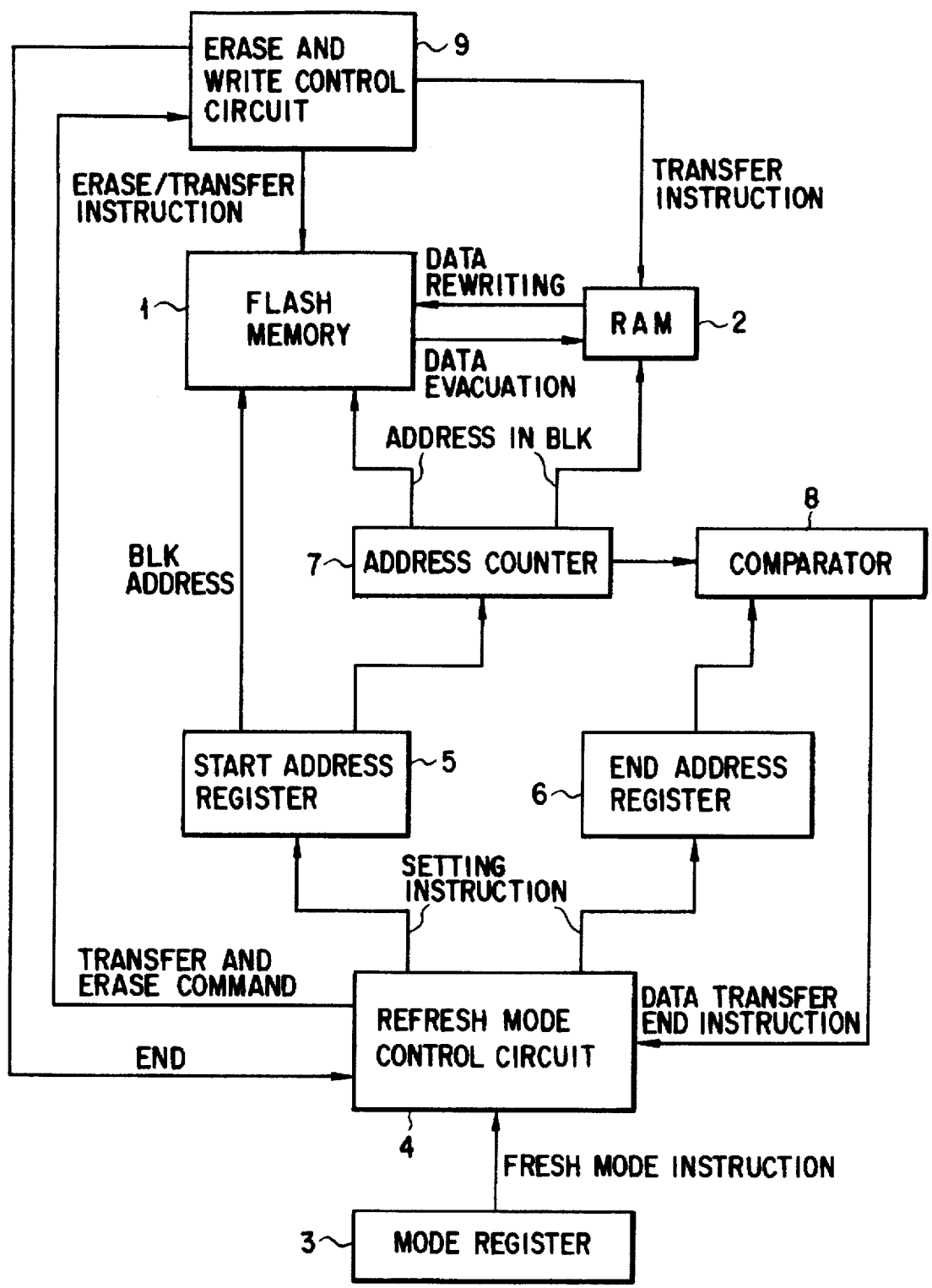
FIG. 1 shows a schematic configuration for implementing a method of rewriting data in a microcomputer additionally provided with a flash memory according to an embodiment of the present invention.

Hereinafter, referring to the drawings, an embodiment of the present invention will be explained.

FIG. 1 shows a schematic configuration for implementing a method of rewriting data in a microcomputer additionally provided with a flash memory according to an embodiment of the present invention.

This configuration includes: a flash memory 1 whose memory cell array is divided into a plurality of blocks; a RAM 2 built in a microcomputer; a mode register 3 for specifying the refresh mode; a refresh mode control circuit 4 that judges whether or not a refreshing voltage is applied; a start address register 5 that generates the start address of an area (one or more blocks) to be refreshed; an end address register 6 that generates the end address; an address counter 7 that counts on the basis of the start address and end address; a comparator 8 that compares the count of the refreshed address in the address counter 7 with the count of the end address and instructs the refresh mode control circuit 4 to end refreshing; and an erase and write control circuit 9 that effects the transfer of the retained data between the flash memory 1 and the RAM 2 and erases the retained data in the flash memory 1 in blocks on the basis of the control signal from the refresh mode control circuit 4.

With the embodiment, to change from the normal operation to the refresh mode, the refresh mode is selected at the mode register 3. The refresh mode may be achieved in the following modes: (1) HARDWARE MODE, (2) MONITOR MODE, and (3) SOFTWARE MODE.

(1) HARDWARE MODE

Figure 2:
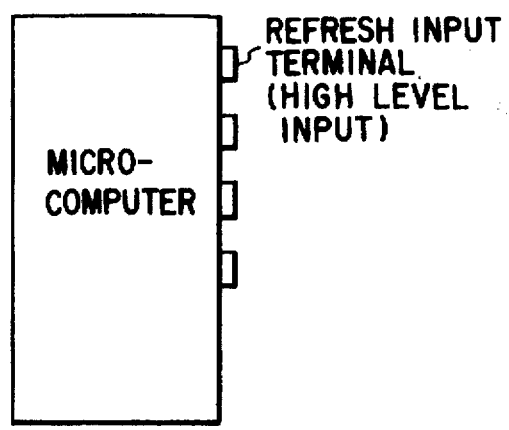
FIG. 2 shows a structure for setting the hardware mode to start data rewriting.

As shown in FIG. 2, an input terminal to effect the refresh mode is provided on the microcomputer. By bringing the potential of the input terminal to a high level, the refresh mode is set in the mode register.

After the mode has been set, the start address and end address of a preset block to be refreshed are set in the mode register as shown in FIG. 3. Then, the data from the start address to the end address is read from the flash memory 1 and temporarily evacuated to the RAM 2.

Thereafter, the block in the area from which the data has been evacuated is erased. After the erase operation has been completed, a series of refreshing processes finishes by writing the data read from the RAM 2 again into the original area in the flash memory 1.

(2) MONITOR MODE

Figure 4:
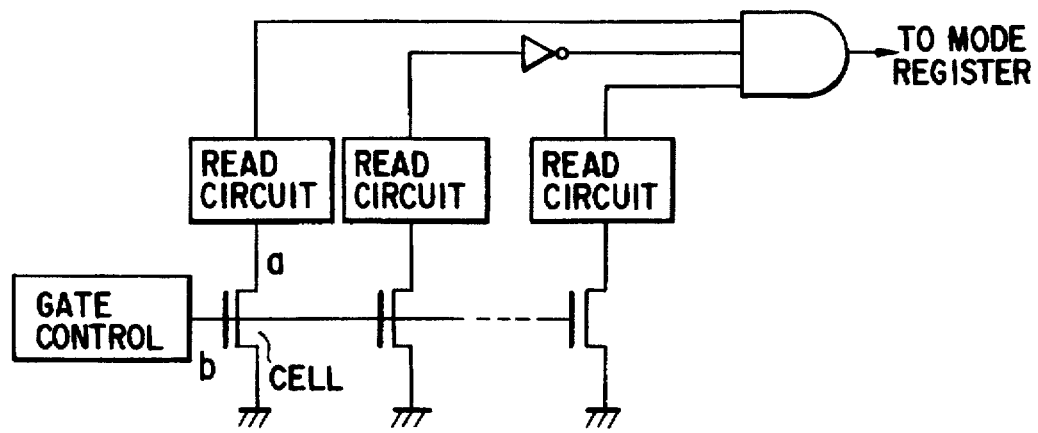
FIG. 4 shows an arrangement to help explain the monitor mode to start data rewriting in the embodiment.

Aside from the matrix (the area divided into blocks) in the body memory that stores the data and control programs, a matrix containing monitor cells each consisting of more than several bits is provided as shown in FIG. 4. For example, a monitoring matrix having at least 2 bits is provided in order to monitor both "0" and "1" of DATA. In consideration of sensitivity of monitor cells, a matrix with a 6-bit structure may be used, wherein three bits are assigned to DATA "1" and three bits to DATA "0". According to this structure, each DATA can be determined on the basis of majority rule. Specifically, this structure is used even if a 1-bit defect is present in a monitor cell from the beginning or even if there is a weak monitor cell.

A reading voltage applied to the cells in the matrix is controlled more strictly than the voltage applied to each cell in the body memory. For example, the monitor cells are used to monitor the data retention by making the voltage "a" applied to the drain of a cell in a read operation somewhat high or the gate voltage "b" somewhat high, or by reading constantly. If any bit in the data in the monitor cells is inverted, the refresh mode will be automatically set in the mode register and a series of refreshing processes as described above will be started.

(3) SOFTWARE MODE

Figure 5:
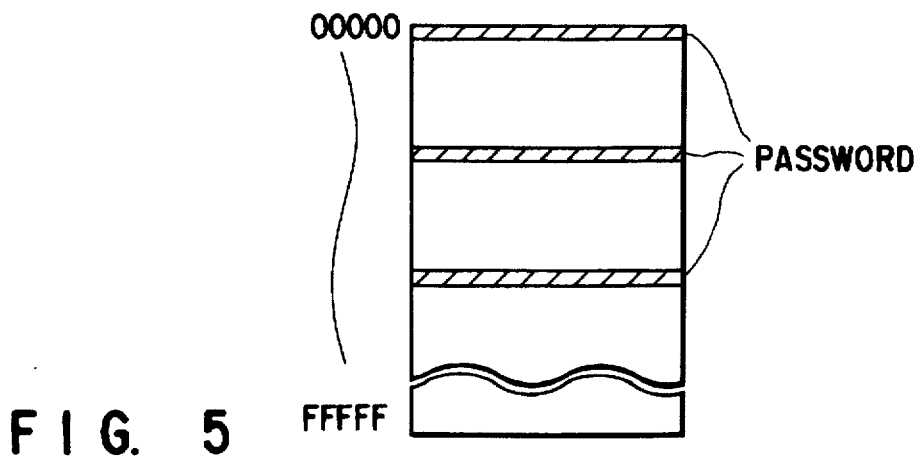
FIG. 5 is a drawing to help explain the software mode to start data rewriting in the embodiment.
Figure 7A:
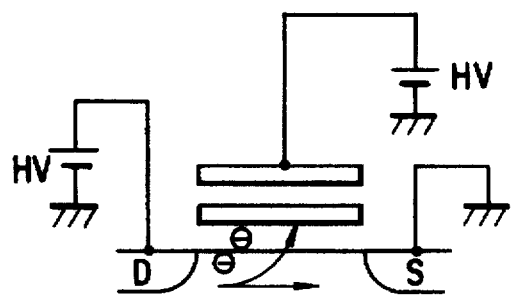
FIGS. 7A and 7B are diagrams to help explain how to write data into and erase data from a conventional flash EEPROM.
Figure 7B:
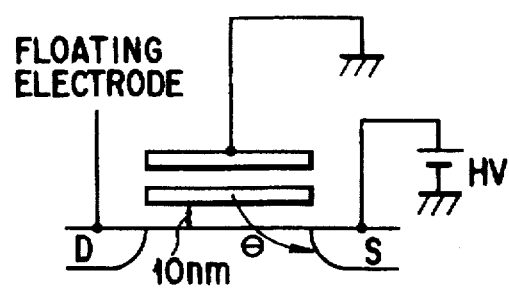
Figure 8:
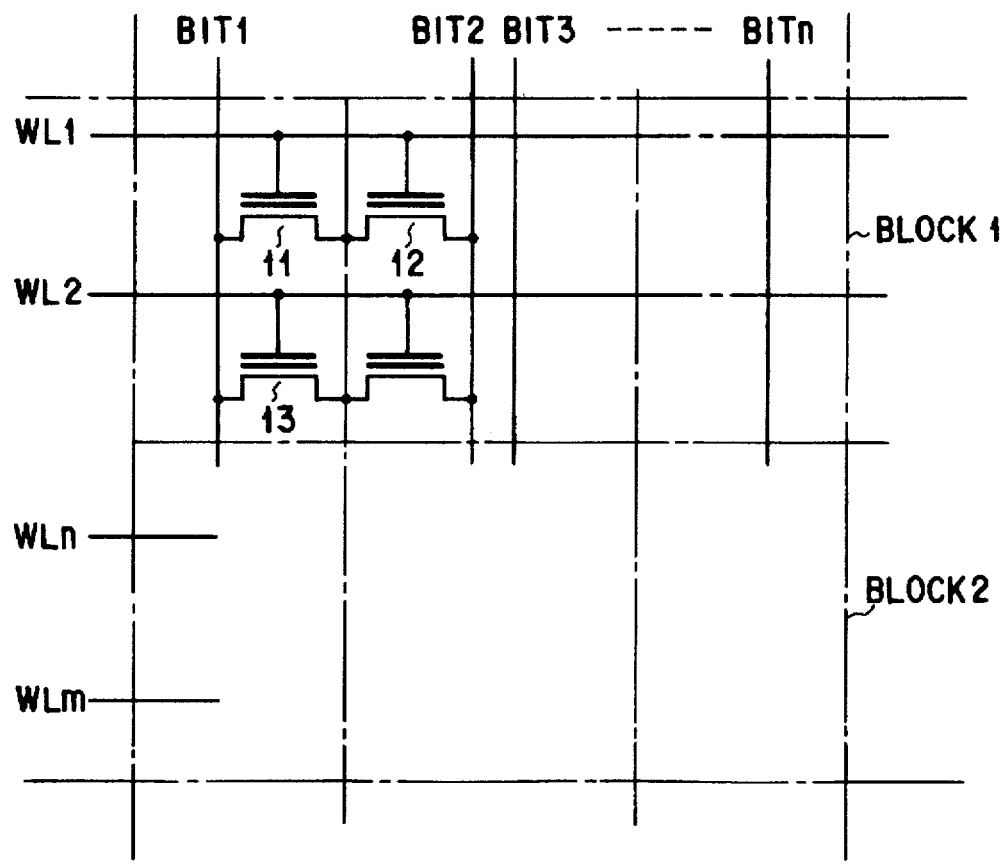
FIG. 8 is a diagram to help explain various disturbances caused in a conventional flash EEPROM.

As shown in FIG. 5, a password is written into a suitable address (one or more bytes) in a memory. A previously written software program monitors at regular intervals whether or not the just entered password coincides with the written password. If confirming that they disagree with each other, the program will automatically set the refresh mode in the mode register. This starts a series of refreshing processes as described above.

A method of rewriting data in a microcomputer additionally provided with a flash memory having the above configuration will be described by reference to the flowchart shown in FIG. 6.

First, when the mode register 3 selects the refresh mode (step S1), the refresh mode control circuit 4 judges whether or not a write/erase specifying voltage (a voltage for refreshing) $V_{PP}$ has been applied (step S2). If it has been applied (YES), the start address and end address of an area (one or more blocks) to be first refreshed will be generated and the start address will be set in the address counter 7 (step S3). If the specifying voltage $V_{PP}$ has not been applied (NO), the refresh mode will not be started.

Then, according to the count in the address counter 7, the retained data is read from the flash memory 1 and transferred to the RAM 2, into which the transferred data is written sequentially (step S4). The addresses in the RAM 2 into which the data is written are different from the addresses on a normal memory map. The data is written into the addresses, starting at address 0, in such a manner that the data first read from the flash memory 1 is written into address 0 in the RAM 2, the data next read is written into address 1 in the RAM 2, and the data read thereafter is written in the same manner. In this way, the area of a block to be refreshed in the flash memory corresponds, on a one-to-one basis, to an area into which the data is written in the RAM 2.

Then, the comparator 8 compares the address of the data to be refreshed in the flash memory 1 with the end address (step S5). If they coincide with each other (YES), the comparator will instruct the refresh mode control circuit 4 to end the transfer, thereby terminating the data transfer to the RAM 2 (temporary evacuation).

Next, according to an instruction given by the refresh mode control circuit 4 to erase the data block evacuated to the RAM 2, the erase and write control circuit 9 executes block erasure (step S6). After having finished the erasure, the control circuit 9 outputs an end indication to the refresh mode control circuit 4.

Then, in response to the end indication, the refresh mode control circuit 4 sets again in the address counter 7 the start address of an area in the flash memory 1 to which the data is transferred from the RAM 2 (step S7). The control circuit then instructs the erase and write control circuit 9 to write again and transfers the data evacuated to the RAM 2 to the flash memory 1 (step S8). After all of the data has been written again (step S9), it is judged whether the operation of refreshing the area (block) in which the data to be refreshed has been stored has been completed (step S10). Control will then return to step S3 and the above-described refreshing operation will be repeated until the rewriting of all of the data has been completed. After the blocks in the entire area in the flash memory has been refreshed, the operation in the present mode ends.

The refresh mode may be effected by specifying an arbitrary block, not restricted to only the entire area. Although the RAM 2 built in the microcomputer is used, the data may be evacuated to an external memory via a port by using a DMA, etc. Instead of being set by the mode register, the refresh mode may be set by an external terminal or be added to a set of instructions. Furthermore, the refresh mode may be added as a refresh command, as in a conventional program or the erase mode.

As described above, with the embodiment, by providing the refresh mode that enables data transfer between the flash memory and the RAM, it is possible to temporarily transfer and evacuate the retained data, which is held in the flash memory and deteriorates due to disturbances or stress caused by read or write operations, and write the retained data again to refresh the data. The refreshing improves the reliability and retainability of the stored data. Combining this approach with a conventional process approach would produce a much better result.

Furthermore, a circuit needed to implement the fresh mode is so small that it affects neither the cell area of the flash memory nor the device configuration.

Therefore, with the present invention, it is possible to provide a method of rewriting data in a microcomputer additionally provided with a flash memory which has a simple configuration and prevents the deterioration of the retained data cause by the driving of memory.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. In a microcomputer having a flash memory that stores data that can be electrically rewritten and includes a memory cell are having memory cells divided into a plurality of blocks, and a memory device that stores data to be written and read, a method of rewriting data in said microcomputer in a refresh mode, comprising the steps of:

evacuating the data from an arbitrary are including at least one of said blocks of said flash memory to said memory device;

erasing the evacuated data from the arbitrary area of said flash memory; and writing the evacuated data back into the arbitrary area from said memory device;

wherein said refresh mode is specified in such a manner that an input terminal to start a refreshing operation is provided on said microcomputer and a potential of said input terminal is set beforehand at a predetermined level, when a signal having a level higher than the predetermined level is input to said input terminal, a flag serving as an interrupt signal is set in a register to start said refreshing mode, thereby starting the refreshing operation.

2. In a microcomputer having a flash memory that stores data that can be electrically rewritten and includes a memory cell area having memory cells divided into a plurality of blocks, and a memory device that stores data to be written and read, a method of rewriting data in said microcomputer in a refresh mode, comprising the steps of:

evacuating the data from an arbitrary area including at least one of said blocks of said flash memory to said memory device; erasing the evacuated data from the arbitrary area of said flash memory; and writing the evacuated data back into the arbitrary area from said memory device;

wherein said microcomputer is provided with matrix cells including cells containing at least two bits in an area separate from said memory cell area, when data is read, a voltage higher than a voltage applied to said memory cells is applied to drains of said matrix cells to monitor data retention, and if any bit of the data in said matrix cells is inverted, a refreshing operation will be started.

3. In a microcomputer having a flash memory that stores data that can be electrically rewritten and includes a memory cell area having memory cells divided into a plurality of blocks, and a memory device that stores data to be written and read, a method of rewriting data in said microcomputer in a refresh mode, comprising the steps of:

evacuating the from an arbitrary area including at least one of said blocks of said flash memory said memory device;

erasing the evacuated data from the arbitrary area of said flash memory; and writing the evacuated data back into the arbitrary area from said memory device;

wherein said microcomputer is provided with matrix cells including cells containing at least two bits in an area separate from said memory cell area, when data is read, a voltage higher than a voltage applied to said memory cells is applied to gates of said matrix cells to monitor data retention, and if any bit of the data in said matrix cells is inverted, a refreshing operation will be started.

4. In a microcomputer having a flash memory that stores data that can be electrically rewritten and includes a memory cell area having memory cells divided into a plurality of blocks, and a memory device that stores data to be written and read, a method Of rewriting data in said microcomputer in a refresh mode, comprising the steps of:

evacuating the data from an arbitrary area including at least one of said blocks of said flash memory to said memory device;

erasing the evacuated data from the arbitrary area of said flash memory; and writing the evacuated data back into the arbitrary area from said memory device;

wherein said microcomputer allows a password to be written at a plurality of addresses in the memory cell area and the password is monitored during operation of said microcomputer, if said password disagrees with an entered password, a refreshing operation will be started.

* * * * *

UNITED STATES PATENT AND TRADEMARK OFFICE
CERTIFICATE OF CORRECTION

PATENT NO. : 5,699,297
DATED : December 16, 1997
INVENTOR(S) : Akihiro YAMAZAKI et al.

It is certified that error appears in the above-indentified patent and that said Letters Patent is hereby corrected as shown below:

```
Claim 1, column 5, line 49, "are" should read
--area--.

Claim 1, column 5, line 53, "are" should read
--area--.

Claim 3, column 6, line 30, after "evacuating the",
insert --data--.

Claim 3, column 6, line 31, before "said memory",
insert --to--.

Claim 4, column 6, line 49, "Of" should read --of--.
```

Signed and Sealed this

Twenty-eighth Day of July, 1998

Attest:

BRUCE LEHMAN

*Attesting Officer*   *Commissioner of Patents and Trademarks*